United States Patent [19]
Uchida et al.

[11] 3,931,632
[45] Jan. 6, 1976

[54] SWITCHING DEVICE EQUIPPED WITH A SEMICONDUCTOR MEMORY ELEMENT

[75] Inventors: Kosaku Uchida, Neyagawa; Tsutomu Kobayashi, Kadoma; Susumu Koike, Fujiidera, all of Japan

[73] Assignee: Matsushita Electric Industrial Co., Ltd., Osaka, Japan

[22] Filed: Mar. 28, 1974

[21] Appl. No.: 455,883

Related U.S. Application Data

[63] Continuation of Ser. No. 318,644, Dec. 26, 1972, abandoned.

[30] Foreign Application Priority Data

Dec. 28, 1971 Japan.................................... 47-69
Dec. 28, 1971 Japan.................................... 47-70
Dec. 28, 1971 Japan.................................... 47-71
Dec. 28, 1971 Japan.................................... 47-72

[52] U.S. Cl. ...................... 357/23; 357/25; 357/54; 357/40; 307/304; 307/308; 340/173
[51] Int. Cl.² ............... H01L 29/78; H01L 29/66; H03K 3/353; G11C 11/44
[58] Field of Search .................. 357/23, 25, 26, 54; 307/304, 308; 340/173 R

[56] References Cited
UNITED STATES PATENTS

3,676,717 7/1972 Lockwood .......................... 307/304
3,693,003 9/1972 Sigsbee et al. ........................ 357/23

OTHER PUBLICATIONS

Compon Tech. (GB) – Vol. 4, No. 5, Oct. 1970, pp. 17–21 – Oakley.

Primary Examiner—Michael J. Lynch
Assistant Examiner—E. Wojciechowicz
Attorney, Agent, or Firm—Stevens, Davis, Miller & Mosher

[57] ABSTRACT

A switching device equipped with a semiconductor memory element in which the semiconductor memory element includes at least one junction region provided on a semiconductor base plate, a thin insulating film through which carriers can pass and an insulating film having a trap level, said two insulating films being disposed on the surface of said semiconductor base plate in stacked layer relationship, thereby providing a memory function. The present device is provided with this semiconductor memory element, a power supply for controlling the semiconductor memory element and means for turning on or off the controlling power supply, thus accomplishing a touch-switching device of high impedance and ensuring its operations with inexpensive cost.

4 Claims, 13 Drawing Figures

SWITCHING DEVICE EQUIPPED WITH A SEMICONDUCTOR MEMORY ELEMENT

This is a continuation of application Ser. No. 318,644, filed Dec. 26, 1972 now abandoned.

The present invention relates to a switching device equipped with a semiconductor memory element, and more particularly to a touch-switching device equipped with a semiconductor element having a memory function.

Conventionally, touch-switching devices had a drawback that they had a complicated structure or circuit arrangement and were expensive although they were advantageously free from operational noise and operated with a soft touch. Further, the touch-switching devices could not disadvantageously retain their previous states upon interruption of the power supply.

An object of the present invention is to provide an inexpensive touch-switching device with simple construction and low occurence of faults.

Another object of the present invention is to provide a touch-switching device operable even by the touch of a semi-conductive substance such as the human body.

A further object of the present invention is to provide a touch-switching device being capable of retaining its previous state even if the power supply is interrupted.

A still further object of the present invention is to produce a touch-switching device positively operable by a touch in a short time.

The objects of the present invention will be attained by employing a semiconductor element having a memory function and high impedance relative to control terminals.

Figure 12:
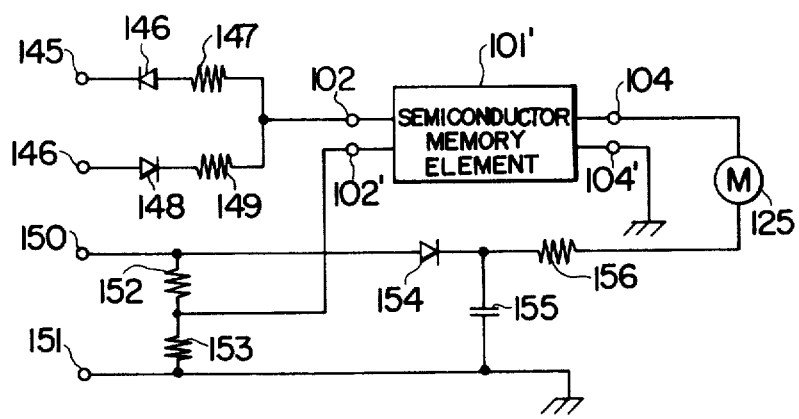
Figure 13:
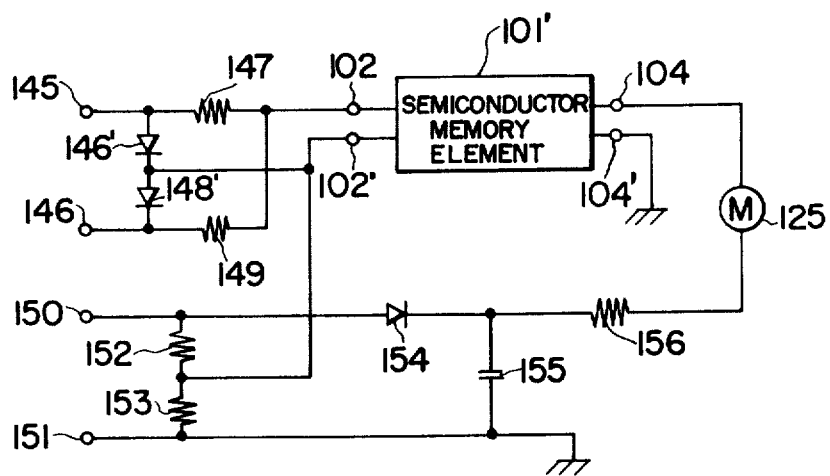

FIG. 12 is a circuit diagram of another embodiment of a control device according to the present invention in which an AC power supply and a reference voltage supply are employed as a power supply to an input portion of the semiconductor memory element with a rectifier connected in series with the AC power supply; and FIG. 13 is a circuit diagram of an embodiment smilar to that of FIG. 12 in which a rectifier is connected in parallel with an AC power supply.

Figure 1:
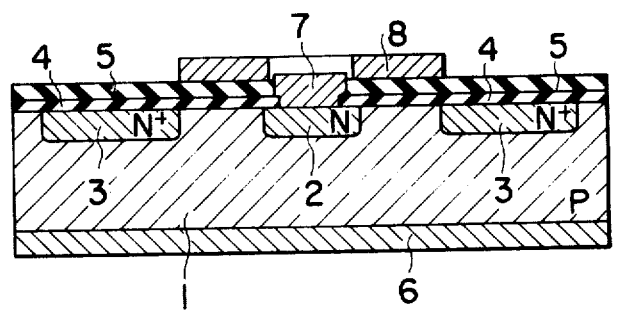
FIG. 1 is a sectional-view showing the structure of an embodiment of a semiconductor memory element of a terminal type employed in a switching device according to the present invention.

The present invention employs a novel semiconductor memory element hitherto not known. Accordingly, the semiconductor memory element employed in a touch-switching device according to the present invention will be briefly described. FIG. 1 shows a structure in section of an embodiment of the semiconductor memory element wherein a silicon base plate or substrate 1 of a P type, for example, is formed at one surface with an N-region 2 and N+-regions 3 of step junction structure in higher concentration than the N-region 2. The surface of the base plate other than portions above the N-region is covered with for example, a thin silicon oxide film 4 and, for example, a silicon nitride film 5 having a trip level in stacked layer relationship. Electrodes 6 to 8 are provided in ohmic contact on the other surface of the base plate 1, on the N-region 2 and on a silicon-insulating film 5, respectively.

Figure 2:
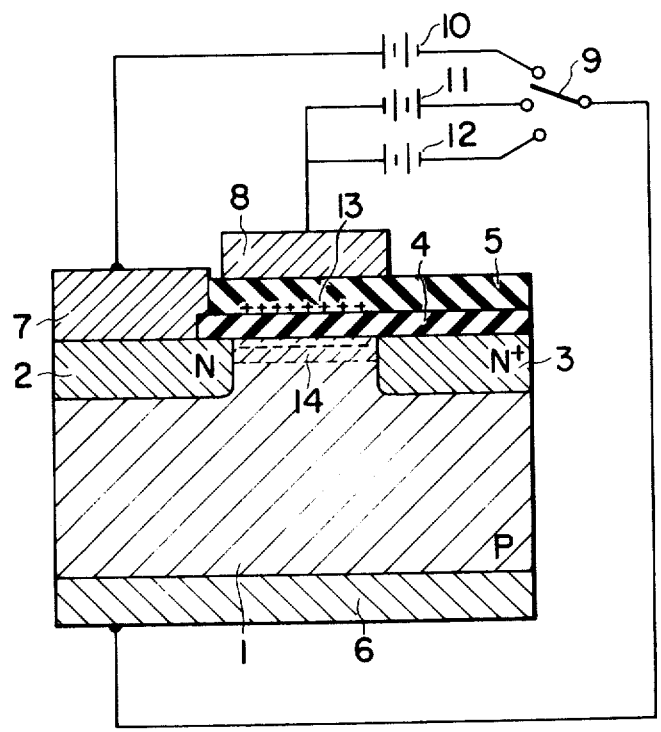
FIG. 2 is an explanatory view illustrating an operational principle of a semiconductor memory element employed in a switching device according to the present invention.

FIG. 2 shows a view for illustrating an operational principle of the element having the above-mentioned structure, in which power supplies 10 to 12 are disposed so as to selectively apply a voltage between the electrodes 6, 7 and between the electrodes 6, 8 by means of a change-over switch 9. It is to be noted, here, that the power supply 10 serves to apply a backward bias voltage to a junction between the p-type silicon base plate 1 and the N-region while the power supplies 11 and 12 are connected so as to apply to the insulating layers 4, 5 the voltage the polarity of which is reversed by changing over the switch 9.

When the power supply 10 is connected between the electrodes 6 and 7 to apply a voltage lower than a breakdown voltage of the PN junction in the regions 1 and 2, a backward saturated current only flows therethrough, the level of which depends upon a junction area in the regions 1, 2 and an insulating condition on the surface, amounting to as little as several nanoamperes ($10^{-9}$A). This state is hereinafter referred to as an off-state of the semiconductor memory element.

The connection of the power supply 11 between the electrodes 6 and 8 by changing over the switch 9 causes electrons to pass through the thin Silicon Oxide film 4 out of the trap level in the silicon nitride film 5 due to the tunnel effect with the result of injection of the electrons to the P-type silicon base plate 1. The injection causes the empty trap level in the silicon nitride film 5, thus forming a positively charged layer 13. The surface on the P-type silicon base plate 1, i..e. the interface facing the silicon oxide film 4 is formed with a reversed layer 14 due to the injection of the electrons.

The disconnection of the power supply 11 in this state prevents the electrons injected into the P-type silicon base plate 1 out of the silicon nitride film 5 passing back to the emptied trap level in the silicon nitride film 5 through the silicon oxide film 4 for recombination because there is no electric field, thus continuing to form the reversed layer 14 for the induction of the positively charged layer 13. The duration period depends upon the film time of the trap level, and amounts to more than 4000 hours for the silicon nitride film 5. This state is referred to as an on-state of the semiconductor memory element. The renewed connection of the power supply 10 between the electrodes 6 and 7 with the formation of the reversed layer 14 causes the backward saturated current to flow therethrough due to the existence of the reversed layer 14 the magnitude of the current being $10^2$ to $10^3$ times as great as that of the current as mentioned above.

If, on the other hand, the N$^+$-region 3 is formed with a step junction so that the PN junction between the region 3 and the P-type silicon base plate 1 may have a smaller withstand voltage than the PN junction between the N-region 2 and the base plate 1, then across the electrodes 6 and 7 flows a current much larger in magnitude than the backward saturated current produced at the formation of only the reversed layer 14. In other words, the formation of the reversed layer 14 establishes the electrical connection between the regions 2 and 3. As a result, the breakdown voltage of the PN junction is determined by either a lower voltage across the regions 1 and 2 or across the regions 1 and 3. Consequently, if the power supply 10 supplies a voltage greater than the breakdown voltage across the regions 1 and 3 then a greater current due to breakdown phenomenon flows through the electrodes 6 and 7. Thus the state in which the reversed layer 14 is formed is again referred to as an on-state of the semiconductor memory element. Thus it will be appreciated that the positively charged layer 13 and the reversed layer 14 are formed to effect a writing operation by employing a power supply of 18 volts, for example, as the power supply 11 and applying the voltage so that the electrode 8 may be negative. A reading operation, on the other hand, will be effected by employing the power supply 10 of 12 volts and by applying the voltage so that the electrode 7 may be positive so that a large current flows through the electrodes 6, 7 due to the breakdown phenomenon. The output current obtained in the off-state and the on-state are 0.5 and 5 miliamperes, respectively, thus ensuring sufficient utility for the memory element.

The erasion of the signal in memory is effected by connecting between the electrodes 6 and 8 the power supply 12 having polarity opposite to that of the power supply 11 used in the writing operation by means of the change-over switch 9. In other words, the connection of the change-over switch 9 to the power supply 12 causes the electric field opposite to that mentioned above to be applied across the insulating films 4 and 5 with the result that the electrons forming the reversed layer 14 pass through the silicon oxide film 4 due to the tunnel effect for recombination with the empty trap level in the silicon nitride film 5. Consequently, the positively charged layer 13 and the reversed layer 14 disappear to restore the semiconductor memory element to the off-state.

It is to be noted that the current flowing through the electrodes 6 and 7 is maintained constant by resistance of the reversed layer 14 when the semiconductor memory element is in the on-state.

Figure 3:
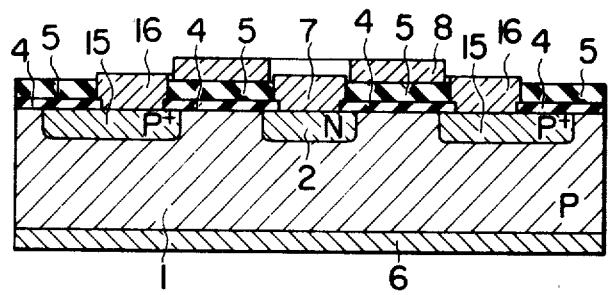
FIG. 3 is a sectional-view showing a structure of another embodiment of a semiconductor memory element of a terminal type.

FIG. 3 shows a modification in part of the element having the above-mentioned structure, the difference exists in that p$^+$-regions 15 are formed in substitution for the N$^+$-region 3, and electrodes 16 are connected in ohmic contact with the regions 15.

In the same way as mentioned above, the application of the voltage between the electrodes 6 and 8 allows the reversed layer to be formed or erased along the interface between the silicon base plate 1 and the silicon oxide film 4 depending upon the polarity of the voltage. The formation of the reversed layer results in the electrical connection of the N-region 2 with the p$^+$-region 15, thus causing the breakdown phenomenon upon application of the backward voltage between the electrodes 7 and 16. As a result, the element is operated with a much lower voltage as compared with the element of the structure as shown in FIG. 1. The reading-out is effected by providing the electrode 7 with negative potential and the electrode 16 with positive potential. The disappearance of the reversed layer causes the PN junction between the P type silicon base plate 1 and the N-region to have a backward withstand voltage greater than the voltage applied between the electrodes 7 and 16, thereby hardly any current flows. It will be understood, therefore, in this case, that the input section is completely separated from the output section. As mentioned above, the semiconductor memory element can substantially permanently retain its on or off-state, and it will suffice only to apply the control voltage in a very short time in order to effect the turning-on or turning-off operation of the element.

The embodiments of the present invention will be successively described in more detail.

Figure 4:
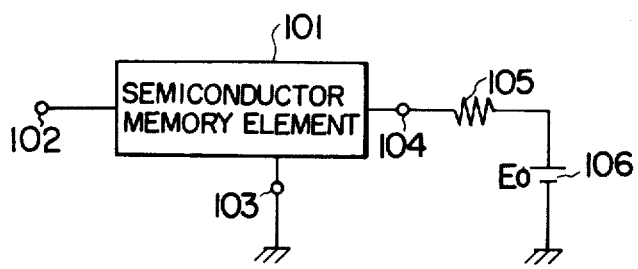
FIG. 4 is a schematic view illustrating an operation of the above-mentioned semiconductor memory element.
Figure 5:
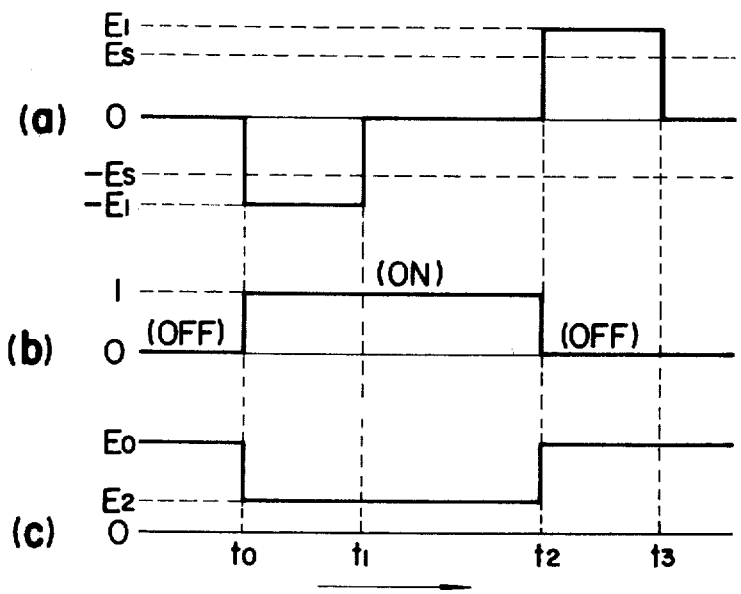
FIG. 5 is a view of voltage wave forms for illustrating an operation of the above-mentioned semiconductor memory element.
Figure 6:
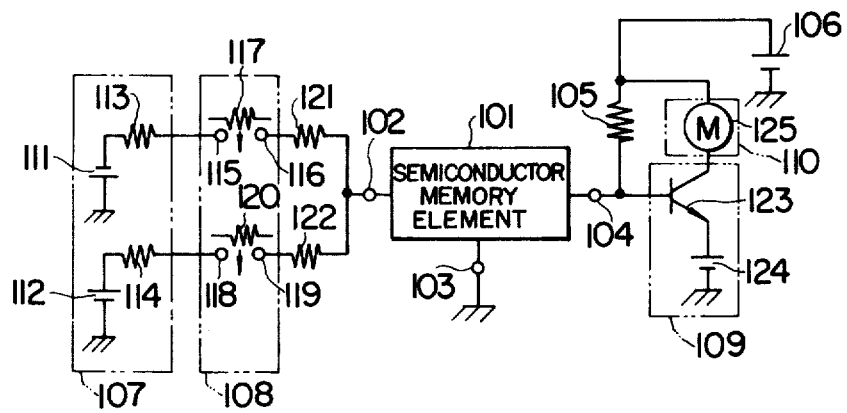
FIG. 6 is a circuit diagram showing one embodiment of a control device according to the present invention in which the above-mentioned semiconductor memory element of a three-terminal type is employed.
Figure 7:
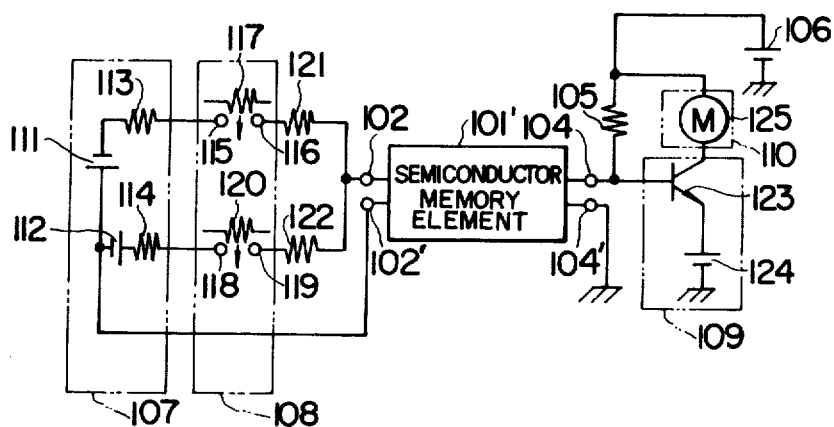
FIG. 7 is a circuit diagram similar to that of FIG. 6 showing another embodiment of a control circuit in which the above-mentioned semiconductor memory element of a four-terminal type is employed.

FIG. 4 is a view showing a fundamental construction of a touch-switching device according to the present invention; FIG. 5 is a view illustrating the operation thereof; and FIGS. 6 and 7 are views showing a typical arrangement of the device in some applications.

An embodiment of a touch-switching device according to the present invention will be described in connection with FIGS. 4 and 5. In FIG. 4 there is shown the above-mentioned semiconductor memory element 101 of a three-terminal structure including an input terminal 102 and a ground terminal 103, corresponding to electrodes 8 and 6, respectively, in FIG. 1, having high impedance there between and an output terminal 104, corresponding to electrode 7 in FIG. 1, connected to a power supply 106 through a resistor 105.

The operation of the thus arranged circuit will be described by reference to FIG. 5. As shown in FIG. 5(a), when a negative trigger voltage $-E_1$ is applied to the input terminal 102 at a time $t_0$, the semiconductor memory element is turned on so that a current I flows through the output terminal 104 as shown in FIG. 5(b) if the voltage $E_1$ exceeds a predetermined negative threshold voltage $-E_s$. Consequently, the voltage at the output terminal 104 is reduced to $E_2$ out of the voltage $E_0$ of the power supply as shown in FIG. 5(c).

After that, even if the voltage $-E_1$ applied to the input terminal 102 is removed, the semiconductor memory element 101 is maintained turned-on. The state remains the same as previously upon recovery of the voltage of the power supply even if the voltage thereof temporarily disappears. This means that a signal in the memory does not vanish upon an interruption of the voltage of the power supply.

Next, when a positive trigger voltage $E_1$ is applied to the input terminal 102 at a time $t_2$ with its level $E_1$ greater than a predetermined positive threshold voltage $E_a$, the semiconductor memory element 101 is turned off for the first time. As a result, the current flowing through the output terminal 104 is interrupted, thereby restoring the voltage at the output terminal 104 to the voltage $E_0$ of the power supply. Afterwards the state remains the same until the negative voltage with its level exceeding the negative threshold voltage $-E_a$ is again applied to the input terminal 102.

Next, the embodiment according to the present invention will be described in connection with FIG. 6, in which elements similar to those of FIG. 4 are indicated with the same reference characters. A power supply 107 for controlling the semiconductor memory element includes a first power supply 111 serving as a negative power supply, a second power supply 112 serving as a positive power supply, and their respective terminal resistors 113 and 114. A switching section 108 includes first contact terminals 115, 116 corresponding to the negative power supply 111, a semiconductive substance 117 rendering these terminals conductive, second contact terminals 118, 119 corresponding to the positive power supply 112, and a semiconductive substance 120 rendering these terminals conductive. A driving circuit 109 comprises a transistor 123 and voltage source 124 for biasing its emitter, and controls a section 110 to be controlled depending upon the level of the voltage produced at the output terminal 104 corresponding to electrode 7 in FIG. 1, of the semiconductor memory element 101. The section 110 may be, for example, a DC motor 125.

On assumption that the semiconductor memory element 101 is at the OFF-state, the high voltage appears at the output terminal 104, thus turning on the transistor 123 to rotate the motor 125. Then if the semiconductive substance 117 touches the first contact terminals 115, 116, the negative volgage from the negative power supply 111 is applied to the input terminal 102 corresponding to electrode 8 in FIG. 1, to turn on the semiconductor memory element 101 with the voltage at its output terminal 104 reduced to thereby stop the motor 125. Even if the semiconductive substance 117 stops touching the first contact terminals 115, 116, the motor 125 remains unactuated. On the other hand, when the semiconductive substance 120 for connecting or disconnecting the voltage from the positive power supply 112 is forced to touch the second contact terminals 118, 119, the positive voltage from the positive power supply 112 is applied to the input terminal 102 to turn off the semiconductor memory element 101 with the motor 125 actuated. After that, even if the semiconductive substance 120 comes out of touch with the second contact terminal 118, 119, the motor 125 does not stop so long as the semiconductive substance 117 comes into touch with the contact terminals 115, 116.

FIG. 7 shows another embodiment similar to that of FIG. 6, in which the semiconductive memory element 101' of a four-terminal structure as shown in FIG. 3 is employed. This semiconductive memory element 101' has a structure in which the input section is isolated from the output section with the grounded terminal 104', corresponding to electrode 16 in FIG. 3, belonging to the output section, and a return terminal 102', corresponding to electrode 6 in FIG. 3, is provided at the input section in substitution therefor. The other constructions and operations are quite the same as those of FIG. 6. It is to be noted, however, that the embodiment of FIG. 7 is adapted for use in the case where the device to be controlled is required to be isolated from the switching section.

Further it is noted that the resistors 121 and 122 in FIGS. 6 and 7 serve to prevent an electric shock as well as to protect the semiconductor memory elements 101 and 101'.

FIGS. 6 and 7 show very fundamental embodiments, which however can be developed for various purposes. The switching portion 108 may be, for example, disposed on a control panel of an apparatus separately from other portions with human fingers serving as the semiconductive substances 117 and 120. In this case, the semiconductor memory element can be operated by putting the fingers in contact with the contact terminals 115, 116, or the contact terminals 118, 119 for controlling of the device 125 to be controlled. Further, the employment of a conductive piece made of a carbonaceous material as the contact terminals 117 and 120 allows the elimination of contact faults. It is obvious that the conventional switches can be employed as the semiconductive substances 117, 120. The reason why such a semiconductive substance can be employed is that advantage is skillfully taken of a nature that the semiconductor memory elements 101, 101' have very large input resistance.

Figure 8:
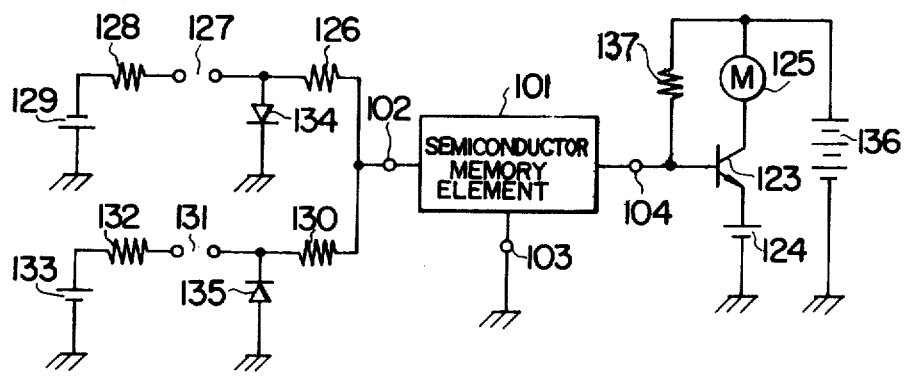
FIG. 8 is a circuit diagram of another embodiment of a control device according to the present invention in which rectifiers are connected to an input portion of the semiconductor memory element in parallel with a power supply.
Figure 9:
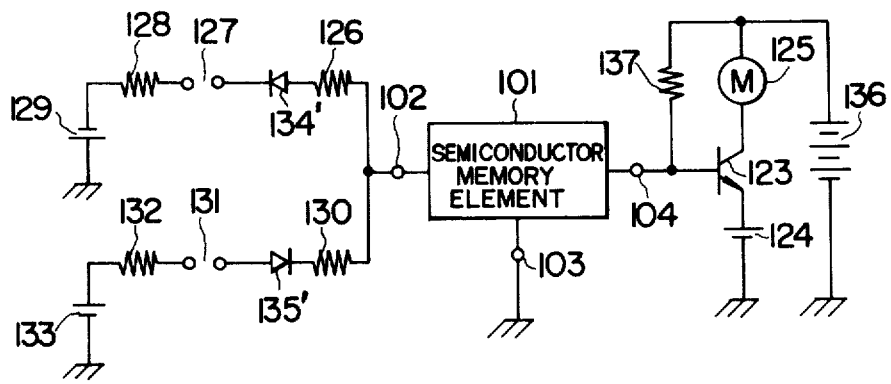
FIG. 9 is a circuit diagram of another embodiment similar to that of FIG. 8 in which rectifiers are connected to an input portion of the semiconductor memory element in series with a power supply.

FIG. 8 shows an arrangement of a further embodiment, and FIG. 9 shows an arrangement of an embodiment similar to that of FIG. 8.

In FIG. 8 there is shown the above-mentioned semiconductor memory element 101 of the three-terminal type including the input terminal 102, the ground terminal 103 and the output terminal 104 as mentioned above, corresponding to electrodes 8, 6 and 7, respectively, in FIG. 1. Between the input terminal 102 and the ground there is connected a series-connected circuit including a resistor 126, a first switching section 127, a resistor 128 and a first power supply 129 of negative polarity, and a series-connected circuit including a resistor 130, a second switching section 131, a resistor 132 and a second power supply 133 of positive polarity. The power supply 129 of negative polarity and the power supply 133 of positive polarity refer to the power supply the positive and negative poles of which are grounded, respectively. A terminal of the resistor 126 connecting with the switching section 127 is grounded through a first diode 134 connected so that its grounded side may be a cathode while a terminal of the resistor 130 connecting with the switching section 131 is grounded through a second diode 135 connected so that its grounded side may be an anode. The switching transistor 123 similar to that of the embodiment as mentioned above has its base connected to the output terminal 104 of the semiconductor memory element 101. The transistor 123 is connected in series with the power supply 124 for biasing its emitter, the above-mentioned motor 125, for example, serving as a collector load and a power supply 136. The transistor 123 further has its base connected to a terminal of the motor side of the power supply 136 through a resistor 137.

With this arrangement, the on-state of the semiconductor memory element 101 causes the transistor 123 to be turned on to rotate the motor 125 because of the high voltage appearing at the output terminal 104. In this state, the touching of a finger to the first switching section 127 is equivalent to a phenomenon that a resistor is inserted between the terminals until now held open. As a result, the semiconductor memory element 101 has its input terminal 102 biased to the negative voltage by the power supply 129 and thus it is turned on. Consequently, the transistor 123 is turned off to interrupt the power supply to the motor 125 because the output terminal 104 of the semiconductor memory element 101 is varied to lower the potential. Even if the finger ceases to contact the first switching section 127, the semiconductor memory element 101 is retained turned-on with the motor 125 held unactuated.

Next if a finger touches the second switching section 131, the input terminal 102 of the semiconductor memory element 101 is varied to a high potential, thereby turning off the element 101. As a result, the transistor 123 is restored to the on-state with the motor 125 again rotating.

Assuming that the first and second diodes 134, 135 are not provided and when a finger touches only the terminal side of the resistor 126 in the first switching section 127, then a so-called AC voltage may be applied from the human body to the terminal and the semiconductor memory element 101 may be subjected to erroneous operation due to the hum voltage because of its very high impedance between the input terminal 102 and the ground terminal 103. The connection of the first diode 134 as shown in FIG. 2, however, causes a component of positive polarity in the hum voltage to be short-circuited with the result that only the component of negative polarity is applied to the input terminal 102, thus preventing the erroneous operation.

This applies to the connection of the second diode 135 in which only the component of positive polarity is applied to the input terminal 102.

FIG. 9 shows an arrangement similar to that of FIG. 8, in which two series circuits, connected between the input terminal 102, corresponding to electrode 8 in FIG. 1 and the ground, have first and second diodes 134', 135' connected in series configuration, respectively, so that the trigger of negative polarity may be always applied from a first power supply of negative polarity while the trigger of positive polarity may be always applied from a second power supply of positive polarity.

It is needless to say that the semiconductor memory element of the four-terminal type can be used in the same way as that of the three-terminal type although the embodiments have been descrived by way of the semiconductor memory element of the three-terminal type. The element of the four-terminal type in which the input side is isolated from the output side is applicable for use in the circuit including the controlling portion and the portion to be controlled the voltages of which are different from each other, thereby eliminating a fear that an operator will receive an electric shock. Obviously, even in the above-mentioned embodiments, electric shock is prevented if the values of the resistors 126, 128 and 130, 132 are made sufficiently great. Therefore, safe operation can be assured even if the first and second switching sections 127, 131 are disposed at a position in direct touch with the human body. In order to switch the first and second switching sections 127, 131, the conductive substance constituted of carbonaceous material may be employed as a substitute for the human body such as a finger. The above-mentioned operations can be realized by softly touching the conductive substance with a finger.

Figure 10:
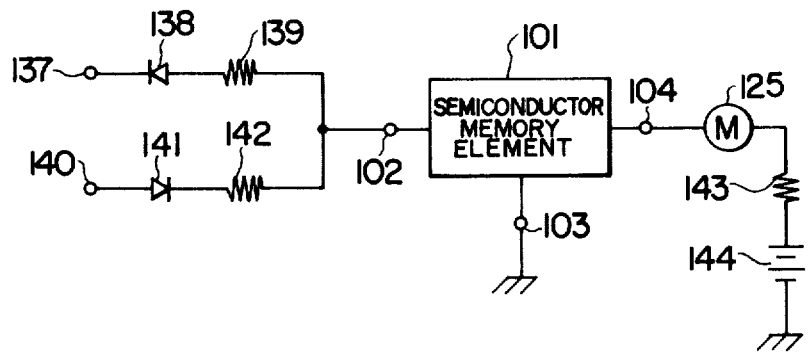
FIG. 10 is a circuit diagram of a further embodiment of a control device according to the present invention in which an AC voltage serving as a power supply is applied to an input portion of the semiconductor memory element with a rectifier connected in series with the power supply.
Figure 11:
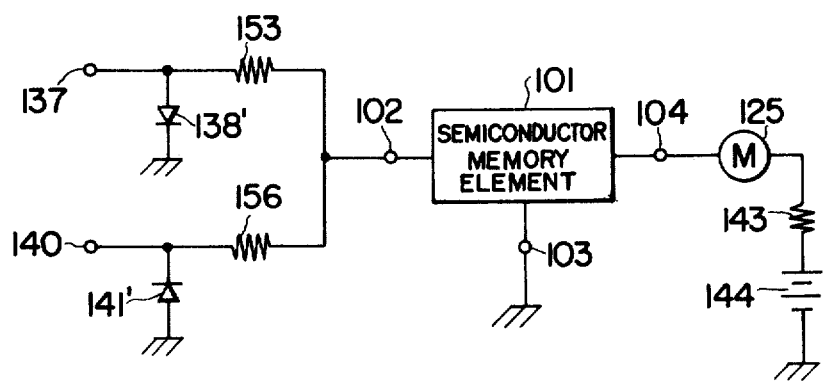
FIG. 11 is a circuit diagram of an embodiment similar to that of FIG. 10 in which a rectifier is connected in parallel with a power supply.

FIG. 10 shows a circuit arrangement of a still further embodiment of the touch-switching device according to the present invention, and FIG. 11 shows a circuit arrangement similar to that of FIG. 10. In FIG. 10 there is shown the above-mentioned semiconductor memory element 101 of the three-terminal type having an input terminal 102, the ground terminal 103 and an output terminal 104. A first controlling input terminal 137 is connected to the input terminal 102 through a series circuit including a first diode 138 and a resistor 139 while a second controlling input terminal 140 is connected thereto through a series circuit including a second diode 141 and a resistor 142. The first and second diodes 138 and 141 are connected in such a way that the terminal sides 137 and 140 may be a cathode and anode, respectively, to apply control signals of respectively opposite polarity to the semiconductor memory element 101. To the output terminal 104 there are connected the motor 125, a resistor 143 and a DC power supply 144 in series configuration in the same way as in the above-mentioned embodiment. It is needless to say, here, that other loads can be used for control in substitution for the motor 125.

With this arrangement, an alternating voltage, applied to the first controlling terminal 137, is rectified by the first diode 138, only the component of negative polarity being applied to the input terminal 102 through the resistor 139. The negative input voltage causes the semiconductor memory element 101 to be turned on when the element 101 was at the off-state. After then, the element 101 retains its on-state, in which a current flows from the power supply 144 to the output terminal 104, thereby rotating the motor 125. On the other hand, the application of an alternating voltage to the input 140 causes only the component of positive polarity to be applied to the input terminal 102 through the second diode 141 to change the semiconductor memory element 101 to the off-state, thereby interrupting the supply to the motor 125 with the result of the stopping thereof.

The application of the voltage to the terminals 137 and 140 can be successfully effected in a short time, and the semiconductor memory element 101 continues to retain its on or off-state even if the applied voltage disappears.

A method for applying a voltage to the terminals 137 and 140 is only to put a finger in touch therewith. The human body generally has a potential including an alternating potential relative to ground potential. This allows the employment of an alternating voltage as the controlling input signal, the alternating voltage being a so-called hum voltage because of the high input impedance of the semiconductor memory element 101. In this case, the resistors 139 and 142 serve as a protective resistor for preventing electric shock.

A particularly provided AC signal source may be connected to the terminals 137 and 140 in substitution for the human body. In this case, the conductive substance made of carbonaceous materials may be used effectively enough to turn on or off the element even if the substance is not connected in a complete manner but in a semiconductive manner.

Thus the protection from electric shock is effected in very ease, so that the terminals 137 and 140 may be disposed at a position to direct touch with the human body.

FIG. 11 shows an arrangement similar to that of FIG. 10, in which the portions corresponding to those of FIG. 10 are marked with the same reference numerals. The difference exists in that the first and second terminals 137 and 140 for applying the control signal voltage are grounded by first and second diodes 138' and 141', respectively. The first diode 138' is connected so as to ground the component of positive polarity in the alternating voltage applied to the terminal 137 while the second diode 141' is connected so as to ground the component of negative polarity in the alternating voltage applied to the terminal 140. In operation, the arrangement of FIG. 11 is exactly the same as that of FIG. 10.

As mentioned above, the touch-switching device according to this embodiment operates the semiconductor memory element to control the device to be controlled in response to the polarity of the alternating voltage applied to the control terminals, thus resulting in a very simplified arrangement. Further any erroneous operation can be eliminated because of the provision of means for rectifying the applied voltage at the control terminals.

FIG. 12 shows a circuit arrangement of the fourth embodiment of a touch-switching device according to the present invention, and FIG. 13 shows a circuit arrangement of an embodiment similar to that of FIG. 12.

FIG. 12 shows an arrangement of another embodiment in which the semiconductor memory element of the above-mentioned structure is employed. In FIG. 12 there is shown the above-mentioned semiconductor memory element 101 of the four-terminal type having the input terminals 102 and 102', corresponding to electrodes 8 and 6, respectively, in FIG. 3, and the output terminals 104 and 104'corresponding to electrodes 7 and 16, respectively, in FIG. 3, the output terminal 104' being grounded. A first controlling input terminal 145 is connected to the input terminal 102 through a series circuit including a first diode 146 and a resistor 147 while a second controlling input terminal 146 is connected thereto through a series circuit including a second diode 148 and a resistor 149. The first and second diodes 146 and 148 are connected in such a way that the sides of terminal 145 and 146 may be a cathode and anode, respectively, to apply control signals of respectively opposite polarity to the semiconductor memory element 101'.

Between commercially available AC power supply terminals 150 and 151 there are connected resistors 152 and 153 in series configuration the connecting point of which is connected to another input terminals 102' of the semiconductor memory element. It is to be noted that the terminal 151 is grounded. Between the terminals 150 and 151 there is further connected a DC power supply circuit including a diode 154, a capacitor 155 and a resistor 156, which is in turn connected to the output terminal 104 of the semiconductor memory element 101' through the load, for example, the motor 125.

The resistors 152 and 153 are inserted between the terminals 150 and 151 and serve to supply the alternating voltage applied between the terminals 150 and 151 to the terminal 102' of the semiconductor memory element. This provides the control voltage applied to the terminal 102 with a reference voltage. At first when the alternating voltage is applied to the control terminal 145, it is rectified by the diode 146, only the component of negative polarity being applied to the input terminal 102 through the resistor 147. The negative input voltage causes the semiconductor memory element 101' to be turned on when the element 101' is at the off-state. After this, the element 101' retains its on-state, in which a current flows from the power supply to the output terminal 104, thereby rotating the motor. On the other hand, the application of the alternating voltage to the input 146 causes only the component of positive polarity to be applied to the input terminal 102 through the diode 148 to change the semiconductor memory element 101' to the off-state, thereby interrupting the supply to the motor 125 with the result of the stopping thereof.

The application of the voltage to the terminals 145 and 146 can be successfully effected in a short time, and the semiconductor memory element 101' continues to retain its on-or off-state even if the applied voltage disappears.

A method for applying voltage to the terminals 145 and 146 is to put a finger in touch therewith. The human body generally has a potential including an alternating potential relative to ground potential. This allows the employment of an alternating voltage as the controlling input signals, the alternating voltage being a so-called hum voltage because of the high input impedance of the semiconductor memory element 101'. In this case, the resistors 147 and 149 serve as a protective resistor for preventing electric shock.

The electric potential of the human body comes near to one of either potential of the terminal 150 or ground potential of the device or apparatus including the terminal 151, and depends upon the circumstances where the device or apparatus is disposed or upon the polarity defined when the terminals 150, 151 are connected to the AC power supply. As a result, when a finger is put in touch with the terminal 145 or 146, the potential difference between the input terminal 102 and the ground has a different absolute value. The application of the alternating voltage from a dividing point of the resistors 152, 153 to the terminal 102' allows the reference voltage to be constant irrespective of the circumstances or polarity to be provided for the voltage applied from the terminals 145, 146 to the terminal 102. In this respect, the voltage supplied from the terminals 145, 146 to the terminal 102 has substantialy the same absolute value relative to the terminal 102', thereby preventing any erroneous operation.

When a finger is put in direct touch with the terminals 145, 146, there arises a fear of electric shock, which is, however, prevented with ease by making the values of the resistors 147, 149, 152 and 153 sufficiently large. Therefore, this allows the exposure of the terminals 145, 146 to the control panel of the device.

A particularly provided AC signal source may be connected to the terminals 145 or 146 in substitution for the human body. In this case, a conductive substance made of cabonaceous materials may be used effectively enough to turn on or off the element even if the substance is not connected in complete manner but in semiconductive manner.

FIG. 13 shows a modification in part of the embodiment shown in FIG. 12, in which diodes 146' and 148' are connected in series between the terminals 145 and 146 so that the side of the terminal 145 may be an anode. The terminal of the diode 146' connecting the diode 148' is connected directly to the input terminal 102, corresponding to electrode 8 in FIG. 3, of the semiconductor memory element 101'. The elements corresponding to those of the above-mentioned embodiment are indicated with the same reference numerals as in the same operations as mentioned above.

In the above-mentioned embodiments, many other circuit arrangements are conceivable for the drive circuit for driving the device to be controlled, sometimes with the elimination of some circuit arrangements. Further it will be obvious that the objects to be controlled may be the switching of the power supply in an apparatus, the turning on or off of a lamp, the changing-over of the analog level such as the level of the sound or turned voltage, the turning on or off of an oscillator, the turning on or off of a signal to be transmitted, the changing-over of a signal frequency, or the like.

As described above, the present invention brings about advantages as follows: the switch is changed-over only by a hand touch on the switching section with its state held unvaried even if the hand touch is removed therewith; the use of the semiconductor memory element makes possible a simplified circuit arrangement, thus providing the inexpensive touch-switching device; the switch is free from wear due to friction found in the conventional switches, thus ensuring the substantially permanent life time; and a touch-switching device of high impedence is obtained which is free from any danger such as electric shocks or fire.

What is claimed is:

1. Switching apparatus, comprising: a semiconductor memory element having a semiconductor substrate of a first conductivity type, first and second regions of a different conductivity type from that of said substrate formed separately in the surface of said substrate and forming corresponding step junctions with said substrate, wherein said second region is highly doped, a first insulating film through which charge carriers can pass overlying all but said first region, and a second insulating film having charge carrier trapping levels overlying said first insulating film; first, second, and third electrodes in contact, respectively, with said first region, said substrate, and said second insulating film; a D.C. source coupled between said first and second electrodes and providing a reverse bias potential between said first and second electrodes; first and second control circuits coupled between said second and third electrodes, said control circuits including means for supplying voltages of opposite polarity between said second and third electrodes; and control terminal means for sensing the touch of a human body and for selectively coupling said first and second control circuits between said second and third electrodes.

2. Switching apparatus, comprising: a semiconductor memory element having a semiconductor substrate of a first type, a first region of different conductivity type from said substrate and a second region of the same conductivity type as said substrate, wherein said second region is highly doped, said first and second regions being formed separately in the surface of said substrate and forming corresponding step junctions with said substrate, a first insulating film through which carriers can pass formed on the surface of said substrate between said first and second regions, and a second insulating film having charge carrier trapping levels formed on said first film between said first and second regions; first, second, third and fourth electrodes in contact, respectively, with said first region, said second region, said second insulating film and said substrate; A.C. power supply and load means connected in series and coupled to said first electrode through an impedance element and rectifier, and to said second electrode to provide a D.C. reverse bias voltage between said first and second electrodes; and further means for selectively coupling an A.C. hum voltage of opposite polarity, induced in a human body from a high impedance coupling to an A.C. line voltage through rectifying means, between said third and fourth electrodes wherein the fourth electrode is connected to a reference A.C. voltage supply means.

3. The apparatus according to claim 2, wherein said selective coupling means comprising: first and second control terminals, to which said A.C. hum voltage is applied, connected to said third electrode through first and second rectifiers whose directions of current flow are opposite each other; and said A.C. reference voltage supply means includes series connected impedance elements across an A.C. supply line and the junction of said series-connected impedance elements is connected to said fourth electrode.

4. The apparatus according to claim 2, wherein said selective coupling means comprises: first and second control terminals, to which said A.C. hum voltage is applied, independently connected to said third electrode; a series-connected circuit including two rectifiers connected between said first and second control terminals, wherein the junction point of said two rectifiers is connected directly to said fourth electrode; and means for supplying said reference A.C. voltage to said fourth electrode.

* * * * *